United States Patent
Inoue et al.

(10) Patent No.: US 6,925,592 B2
(45) Date of Patent: Aug. 2, 2005

(54) TURBO DECODER, TURBO ENCODER AND RADIO BASE STATION WITH TURBO DECODER AND TURBO ENCODER

(75) Inventors: Takao Inoue, Yokohama (JP); Naoki Tsubaki, Zushi (JP); Masayasu Suzuki, Yokohama (JP); Arata Nakagoshi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 562 days.

(21) Appl. No.: 09/934,601

(22) Filed: Aug. 23, 2001

(65) Prior Publication Data

US 2002/0170016 A1 Nov. 14, 2002

(30) Foreign Application Priority Data

May 10, 2001 (JP) ........................................ 2001-139443

(51) Int. Cl.⁷ ............................................ H03M 13/03
(52) U.S. Cl. ........................ 714/787; 714/702; 714/755; 714/786; 375/341; 360/48

(58) Field of Search .................................. 714/787, 702, 714/786, 794, 762, 755; 375/341, 233; 360/48, 53; 711/220

(56) References Cited

U.S. PATENT DOCUMENTS 6,549,998 B1 * 4/2003 Pekarich et al. ............. 711/220
2003/0023909 A1 * 1/2003 Ikeda et al. .................. 714/702

* cited by examiner

Primary Examiner—Albert Decady
Assistant Examiner—Dipakkumar Gandhi
(74) Attorney, Agent, or Firm—Mattingly, Stanger, Malur & Brundidge, P.C.

(57) ABSTRACT

In an interleaver for use in a turbo decoder, a deinterleaver, or an interleaver for use in a turbo encoder, an offset is set based on previously determined thresholds in accordance with symbol numbers generated by a counter. A symbol numbers inputted immediately before generating an address is corrected with the set offset, and the corrected symbol number is converted to generate an interleave read address.

16 Claims, 8 Drawing Sheets

FIG. 3

| N' = 250 | | N' = 506 | | N' = 1018 | | N' = 2042 | | N' = 4090 | |
|---|---|---|---|---|---|---|---|---|---|
| SYMBOL NUMBER | ADDRESS VALUE | SYMBOL NUMBER | ADDRESS VALUE | SYMBOL NUMBER | ADDRESS VALUE | SYMBOL NUMBER | ADDRESS VALUE | SYMBOL NUMBER | ADDRESS VALUE |
| 31 | 251 | 63 | 506 | 63 | 1018 | 863 | 2043 | 1599 | 4090 |
| 63 | 254 | 95 | 511 | 223 | 1019 | 927 | 2045 | 2015 | 4091 |
| 127 | 252 | 191 | 510 | 383 | 1020 | 991 | 2047 | 2431 | 4092 |
| 159 | 255 | 287 | 509 | 543 | 1021 | 1855 | 2042 | 2847 | 4093 |
| 191 | 250 | 383 | 508 | 703 | 1022 | 1919 | 2044 | 3263 | 4094 |
| 223 | 253 | 479 | 507 | 863 | 1023 | 1983 | 2046 | 3679 | 4095 |

FIG. 6

| | SYMBOL NUMBER FOR N' = 250 | | | | | | |
|---|---|---|---|---|---|---|---|
| | 0–30 | 31–61 | 62–124 | 125–155 | 156–186 | 187–217 | 218–249 |
| THRESHOLD 30 | 0 | 1 | 1 | 1 | 1 | 1 | 1 |
| THRESHOLD 61 | 0 | 0 | 1 | 1 | 1 | 1 | 1 |
| THRESHOLD 124 | 0 | 0 | 0 | 1 | 1 | 1 | 1 |
| THRESHOLD 155 | 0 | 0 | 0 | 0 | 1 | 1 | 1 |
| THRESHOLD 186 | 0 | 0 | 0 | 0 | 0 | 1 | 1 |
| THRESHOLD 217 | 0 | 1 | 2 | 3 | 4 | 5 | 6 |
| OFFSET | 0 | 1 | 2 | 3 | 4 | 5 | 6 |

| | SYMBOL NUMBER | THRESHOLD | OFFSET |
|---|---|---|---|
| THRESHOLD 1 | 0-30 | - | +0 |
| THRESHOLD 2 | 31-61 | 30 | +1 |
| THRESHOLD 3 | 62-124 | 61 | +2 |
| THRESHOLD 4 | 125-155 | 124 | +3 |
| THRESHOLD 5 | 156-186 | 155 | +4 |
| THRESHOLD 6 | 187-217 | 186 | +5 |
| ... | 218-249 | 217 | +6 |
| THRESHOLD n | Xa~Xb | n | +Y |

N'=506

| | SYMBOL NUMBER | THRESHOLD | OFFSET |
|---|---|---|---|
| THRESHOLD 1 | 0-62 | - | +0 |
| THRESHOLD 2 | 63-93 | 62 | +1 |
| THRESHOLD 3 | 94-188 | 93 | +2 |
| THRESHOLD 4 | 189-283 | 188 | +3 |
| THRESHOLD 5 | 284-378 | 283 | +4 |
| THRESHOLD 6 | 379-473 | 378 | +5 |
| ... | 474-505 | 473 | +6 |
| THRESHOLD n | Xa~Xb | n | +Y |

N'=1018

| | SYMBOL NUMBER | THRESHOLD | OFFSET |
|---|---|---|---|
| THRESHOLD 1 | 0-62 | - | +0 |
| THRESHOLD 2 | 63-221 | 62 | +1 |
| THRESHOLD 3 | 222-380 | 221 | +2 |
| THRESHOLD 4 | 381-539 | 380 | +3 |
| THRESHOLD 5 | 540-698 | 539 | +4 |
| THRESHOLD 6 | 699-857 | 698 | +5 |
| ... | 858-1017 | 857 | +6 |
| THRESHOLD n | Xa~Xb | n | +Y |

N'=2042

| | SYMBOL NUMBER | THRESHOLD | OFFSET |
|---|---|---|---|
| THRESHOLD 1 | 0-862 | - | +0 |
| THRESHOLD 2 | 863-925 | 862 | +1 |
| THRESHOLD 3 | 926-988 | 925 | +2 |
| THRESHOLD 4 | 989-1851 | 988 | +3 |
| THRESHOLD 5 | 1852-1914 | 1851 | +4 |
| THRESHOLD 6 | 1915-1977 | 1914 | +5 |
| ... | 1978-2041 | 1977 | +6 |
| THRESHOLD n | Xa~Xb | n | +Y |

N'=4090

| | SYMBOL NUMBER | THRESHOLD | OFFSET |
|---|---|---|---|
| THRESHOLD 1 | 0-1598 | - | +0 |
| THRESHOLD 2 | 1599-2013 | 1598 | +1 |
| THRESHOLD 3 | 2014-2428 | 2013 | +2 |
| THRESHOLD 4 | 2429-2843 | 2428 | +3 |
| THRESHOLD 5 | 2844-3258 | 2843 | +4 |
| THRESHOLD 6 | 3259-3673 | 3258 | +5 |
| ... | 3674-4089 | 3673 | +6 |
| THRESHOLD n | Xa~Xb | n | +Y |

FIG. 7

| INPUT SEQUENCE | INPUT SYMBOL NUMBER | INTERLEAVER WRITE ADDRESS | OUTPUT SYMBOL NUMBER | ADDRESS CONVERTER INPUT | INTERLEAVER READ ADDRESS | OUTPUT SEQUENCE |
|---|---|---|---|---|---|---|
| D0 | 0 | 0 | 0 | 0 | 1 | D1 |
| D1 | 1 | 1 | 1 | 1 | 129 | D129 |
| D2 | 2 | 2 | 2 | 2 | 67 | D67 |
| D3 | 3 | 3 | 3 | 3 | 197 | D197 |
| ... | ... | ... | ... | ... | ... | ... |
| D30 | 30 | 30 | 30 | 30 | 125 | D125 |
| D31 | 31 | 31 | 31 | 32 | 2 | D2 |
| D32 | 32 | 32 | 32 | 33 | 130 | D130 |
| ... | ... | ... | ... | ... | ... | ... |
| D61 | 61 | 61 | 61 | 62 | 122 | D122 |
| D62 | 62 | 62 | 62 | 64 | 3 | D3 |
| D63 | 63 | 63 | 63 | 65 | 131 | D131 |
| D64 | 64 | 64 | 64 | 66 | 65 | D65 |
| D65 | 65 | 65 | 65 | 67 | 199 | D199 |
| ... | ... | ... | ... | ... | ... | ... |
| D192 | 192 | 192 | 192 | 197 | 163 | D163 |
| ... | ... | ... | ... | ... | ... | ... |
| D247 | 247 | 247 | 247 | 253 | 184 | D184 |
| D248 | 248 | 248 | 248 | 254 | 120 | D120 |
| D249 | 249 | 249 | 249 | 255 | 248 | D248 |

TURBO DECODER, TURBO ENCODER AND RADIO BASE STATION WITH TURBO DECODER AND TURBO ENCODER

BACKGROUND OF THE INVENTION

The present invention relates to a turbo encoder, turbo decoder for receiving, error-correcting and decoding encoded data, and a radio base station which includes the turbo encoder and turbo decoder.

In radio communications of the next generation, communications are to be performed using turbo codes for providing noise immunity such as randomness and burstability.

The turbo encoding involves convolutional encoding data Xs to generate a sequence of packets (data sequence) X1, ..., Xn, reordering the data Xs in accordance with a predetermined rule defined by 3GPP2 C.S0024 Version 2.0 cdma2000 High Rate Packet Data Air Interface Specification, pp9–43~44, Oct. 27, 2000 (hereinafter abbreviated as "Document 1") to generate data Ys, convolutional encoding the data Ys to generate another sequence of packets (data sequence) Y1, ... Ym, and transmitting/receiving (encoding/decoding) these sequences of packets for communication. The conversion of the order in which the data sequence is arranged is called "interleaving," and the reverse conversion is called "deinterleaving."

Document 1 shows an approach for the interleaving, wherein FIG. 9.2.1.3.4.2.3-1 defines a method of generating, correcting or recalculating addresses of a memory at which data is written/read for interleaving. For example, assuming that a data sequence has N (bits), the data sequence except for tail bits has N' (bits), and the data sequence N' (=250) is interleaved, sequential addresses from 0 to 249 are issued by a counter, and the sequence of data is written into the memory one by one at the addresses. However, in the provision of Document 1, a special method is used to calculate random read addresses of the memory for increasing the randomness in order to secure the noise immunity. Since this calculation method may calculate addresses at which no data exists on the memory such as 251, 252, Document 1 also involves correction or recalculation of calculated addresses.

Therefore, for implementing the address generator, an address correction capability must be provided to regenerate read addresses of the memory from which data are read. Such address regeneration processing causes a complicated feature for generating addresses, additional processing time, and a larger processing delay in a turbo decoder.

Generally, for designing a specific address generator as mentioned above including a function of correcting generated addresses, corrected read addresses are previously listed in a table to provide a read address calculated in accordance with Document 1 and a correct read address by referencing and the table. For example, a technique described in JP-A-2001-53624 (hereinafter abbreviated as "Document 2") employs a method of storing data write/read addresses of an interleaver/deinterleaver in a memory.

A turbo decoder described in Document 2 must have interleave read addresses or deinterleave write addresses in a memory. Also, since a plurality of data sequences must be provided corresponding to data transmission rates depending on communication conditions, a required capacity of memory is increased. For example, when a data sequence N of a packet is 256 (N=256), a memory having a capacity of 2048 bits (8×256) is required. Generally, current communication systems provide a plurality of data sequences corresponding to data transmission rates, and select a data sequence corresponding to a transmission rate in accordance with a particular communication condition. Such a communication system requires a memory capacity of 4608 (9×512) bits when the data sequence N is 512 (N=512); 10240 bits (10×1024) when the data sequence N is 1024 (N=1024); 22528 (11×2048) bits when the data sequence N is 2048 (N=2048); and 49152 (12×4096) bits when the data sequence N is 4096 (N=4096). Specifically, if a conventional decoder is designed to support all the data sequences N=256, 512, 1024, 2048, 4096, a required memory capacity sums up to 88576 bits. This results in a significant increase in circuit size and larger power consumption.

SUMMARY OF THE INVENTION

It is an object of the present invention to provide a turbo encoder and a turbo decoder which can be implemented with an interleave read address generator or a deinterleave write address generator in smaller circuit size, and a radio base station which comprises the turbo encoder and turbo decoder.

It is another object of the present invention to provide a turbo encoder and a turbo decoder which are capable of reducing a circuit size and power consumption by sharing a single address generator for an interleave read address generator and a deinterleave write address generator, and a radio base station which comprises the turbo encoder and turbo decoder.

To achieve the above objects, in one aspect of the present invention, a turbo decoder includes an interleave address generator which sets an offset based on previously determined thresholds in accordance with symbol numbers generated by a counter. This can avoid outputting read addresses at which no data exists on a memory even in the provision indicated in Document 1, and implement an interleave read address generator or a deinterleave write address generator in smaller circuit size.

BRIEF DESCRIPTION OF THE DRAWINGS

FIG. 3 is a table for explaining the operation for generating interleave addresses defined in 3GPP2;

FIG. 4 is a table for explaining the operational principles for an interleave read address generator included in the turbo decoder/encoder according to one embodiment of the present invention;

FIG. 6 is a truth table showing the operation logic of an offset determination unit which forms part of an address generator included in the turbo decoder/encoder in the embodiment of the present invention;

FIG. 7 is a table for explaining the operation of the radio base station which comprises the turbo decoder/encoder of the present invention;

DETAILED DESCRIPTION OF THE EMBODIMENTS

Figure 1:
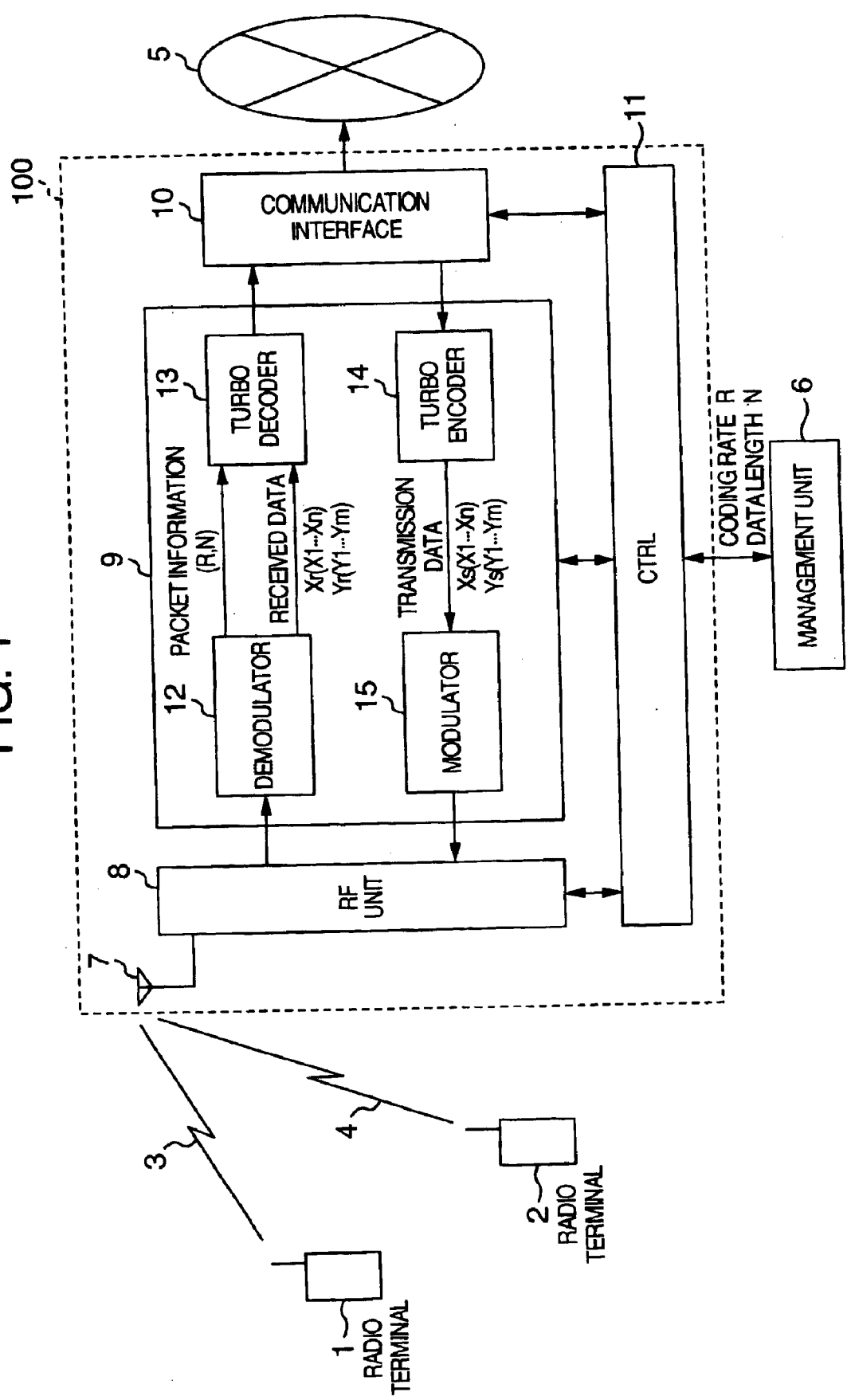
FIG. 1 is a block diagram illustrating an exemplary configuration of a communication system which employs a radio base station that comprises a turbo decoder/encoder according to the present invention.

In the following, embodiments of a turbo decoder/encoder according to the present invention, and a radio base station comprising the same will be described in detail with reference to the accompanying drawings. In the following description and respective drawings, components having similar functions are designated the same reference numerals, and repeated description thereon is omitted.

FIG. 1 is a block diagram illustrating an exemplary configuration of an overall radio communication system comprising a radio base station which is equipped with a turbo decoder and a turbo encoder according to the present invention. The illustrated radio communication system comprises a radio base station 100; radio terminals such as 1, 2; radio channels such as 3, 4; a communication network 5 for connecting the radio base station 100 to other communication devices; and a management unit 6 for managing and controlling the radio base station 100. The radio base station 100 of the present invention communicates with a radio terminal such as 1, 2 through a radio channel such as 3, 4. The radio base station 100 comprises an antenna 7; an RF (Radio Frequency) unit 8 for transmitting and receiving high frequency signals; a baseband unit 9 responsible for encoding, decoding and so on of data; a communication interface 10; and a controller (CTRL) 11 for controlling the overall base station 100. More specifically, the baseband unit 9 comprises a demodulator 12 for demodulating a sequence received from a terminal; a turbo decoder 13 for error-correction decoding received data Xr (X1 . . . Xn), Yr (Y1 . . . Ym) (n, m are integers equal to or larger than two) based on packet information (coding rate R, data length N); a turbo encoder 14 for error-correction encoding data Xs ($1 \leq s \leq n$); and a modulator 15 for generating a transmission signal for transmission data Xs (X1 . . . Xn), Ys (Y1 . . . Ym). Packet information required for turbo encoding and decoding includes the coding rate R, data length N and so on. Here, "data on packet information" corresponds to "information bit," and the data length N corresponds to the number of information bits. The management unit 6 may be included in the radio base station 100, or a management unit (not shown) of the communication network 5 may act for this function.

Figure 2:
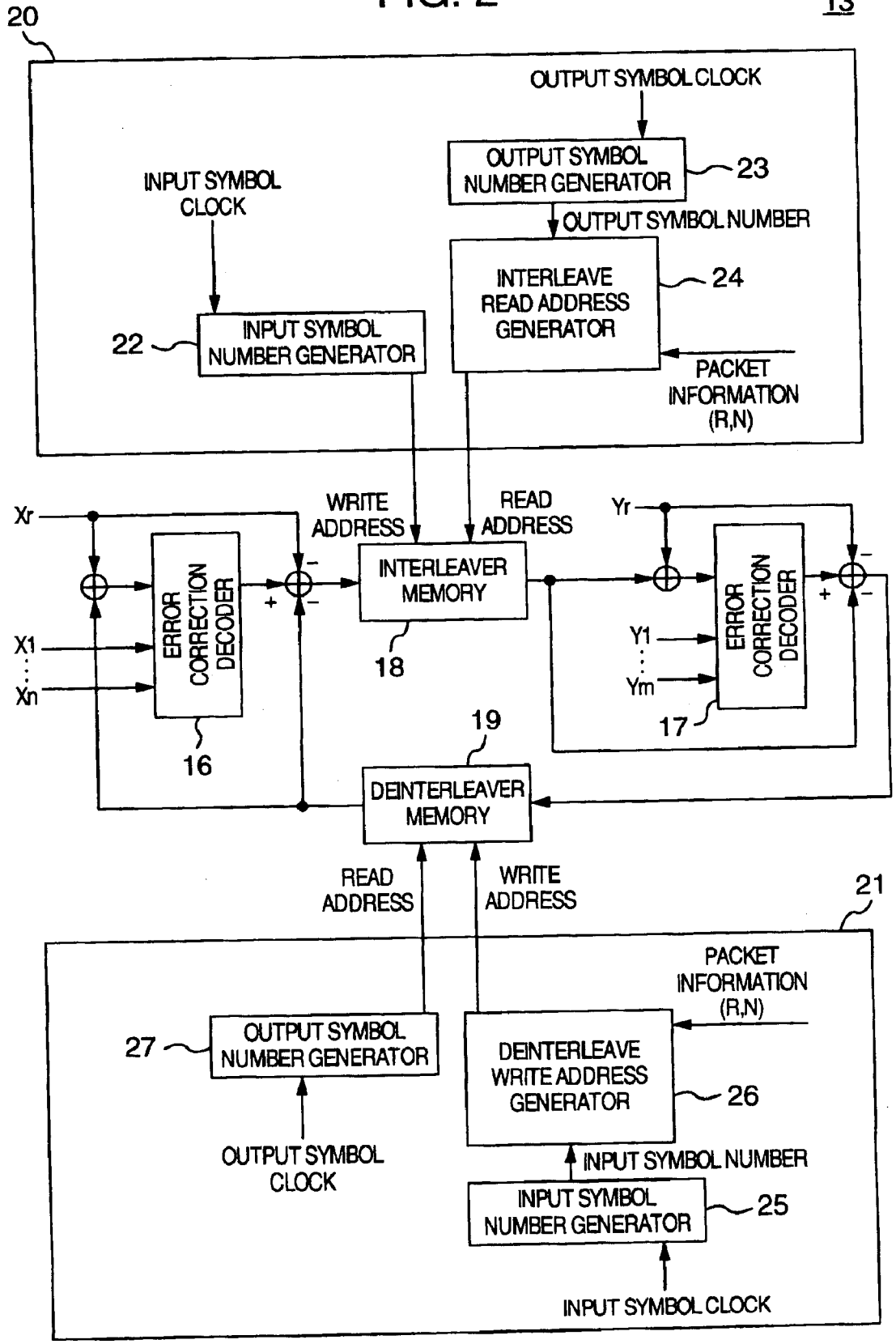
FIG. 2 is a block diagram illustrating an exemplary configuration of a turbo decoder according to one embodiment of the present invention.

FIG. 2 is a block diagram illustrating an exemplary configuration of the turbo decoder 13 according to the present invention. The turbo decoder 13 comprises an error correction decoder 16 for error-correction decoding a sequence of data X1 . . . Xn resulting from convolutional encoding of the sequence of data Xs; an error-correction decoder 17 for error-correction decoding a sequence of data Y1 . . . Ym resulting from convolutional encoding of a sequence of interleaved data Y; an interleaver memory 18; a deinterleaver memory 19; an interleave address generator 20; and a deinterleave address generator 21.

The interleave address generator 20 manages write/read addresses for the interleaver memory 18. An input symbol number generator 22 for generating write addresses for the interleaver memory 18 receives an input symbol clock supplied from the outside, generates sequential numbers in response to the clock; and generates interleave write addresses for writing an input sequence into the interleaver memory 18. An output symbol number generator 23 for outputting a symbol number generated by a built-in counter receives an output symbol clock supplied from the outside, similar to the input symbol clock supplied to the input symbol number generator 22, and generates sequential numbers (output symbol numbers) in response to the output symbol clock. Though the configuration and operation will be described later in detail, in the present invention, random read addresses are generated from the memory. Specifically, the interleave read address generator 24 previously adds an offset to an output symbol number generated by the output symbol number generator 23 for correction to avoid generating addresses in the memory, calculated in accordance with the provision of Document 1, at which no data exists, and generates an interleave read address from the corrected output symbol number for randomly reading a data sequence stored in the interleaver memory 18. The output symbol numbers generated herein as well as write addresses and read addresses to the interleaver memory 18 are processed in packets (data sequence X1 . . . Xn or Y1 . . . Ym)

The deinterleave address generator 21 manages write/read addresses for the deinterleaver memory 19. An input symbol number generator 25 for outputting symbol numbers generated by a built-in counter receives an input symbol clock supplied from the outside, and generates sequential numbers (input symbol numbers) in response to the clock. Though the configuration and operation will be described later in detail, in the present invention, random write addresses are generated to the memory. Specifically, the deinterleave write address generator 26 previously adds an offset to an input symbol number generated by the input symbol number generator 25 for correction to avoid generating addresses in the memory, calculated in accordance with the provision of Document 1, at which no data exists, and generates a deinterleave write address from the corrected input symbol number for randomly writing an input sequence into the deinterleaver memory 19. An output symbol number generator 27 for generating read addresses to the deinterleaver memory 19 receives an output symbol clock supplied from the outside, similarly to the input symbol clock supplied to the input symbol number generator 25; generates sequential numbers in response to the clock; and generates deinterleave read addresses for reading a data sequence stored in the deinterleaver memory 19. The input symbol number generated herein as well as write addresses and read addresses to the deinterleaver memory 19 are processed in packets (data sequence X1 . . . Xn or Y1 . . . Ym).

FIG. 3 is a table showing for each data sequence (excluding tail bits) the addresses in the memory generated in accordance with the provision of Document 1 at which no data exists. In this event, addresses must be regenerated based on the provision of Document 1, causing a complicated feature for generating the addresses, additional processing time therefor, and a large processing delay in the turbo decoder.

FIG. 4 is a table showing the operational principles of the interleave read address generator 24 in the embodiment of the present invention. The interleave read address generator 24 of the turbo decoder included in a radio communication device in the embodiment of the present invention sets an offset based on a previously determined threshold in accordance with a symbol number generated by the counter built in the output symbol number generator 23, as shown in FIG. 4, to avoid generating addresses in the memory at which no data exists, as shown in FIG. 3. Specifically, turbo encoding and decoding are performed through operational processing using simple hardware, later described, to previously correct symbol numbers inputted to the address converter so as to secure the noise immunity and maintain the randomness.

The symbol numbers corrected in this way are inputted to the address converter to prevent the generation of addresses in the memory at which no data exists and to eliminate the need for recalculating interleave read addresses.

Figure 5:
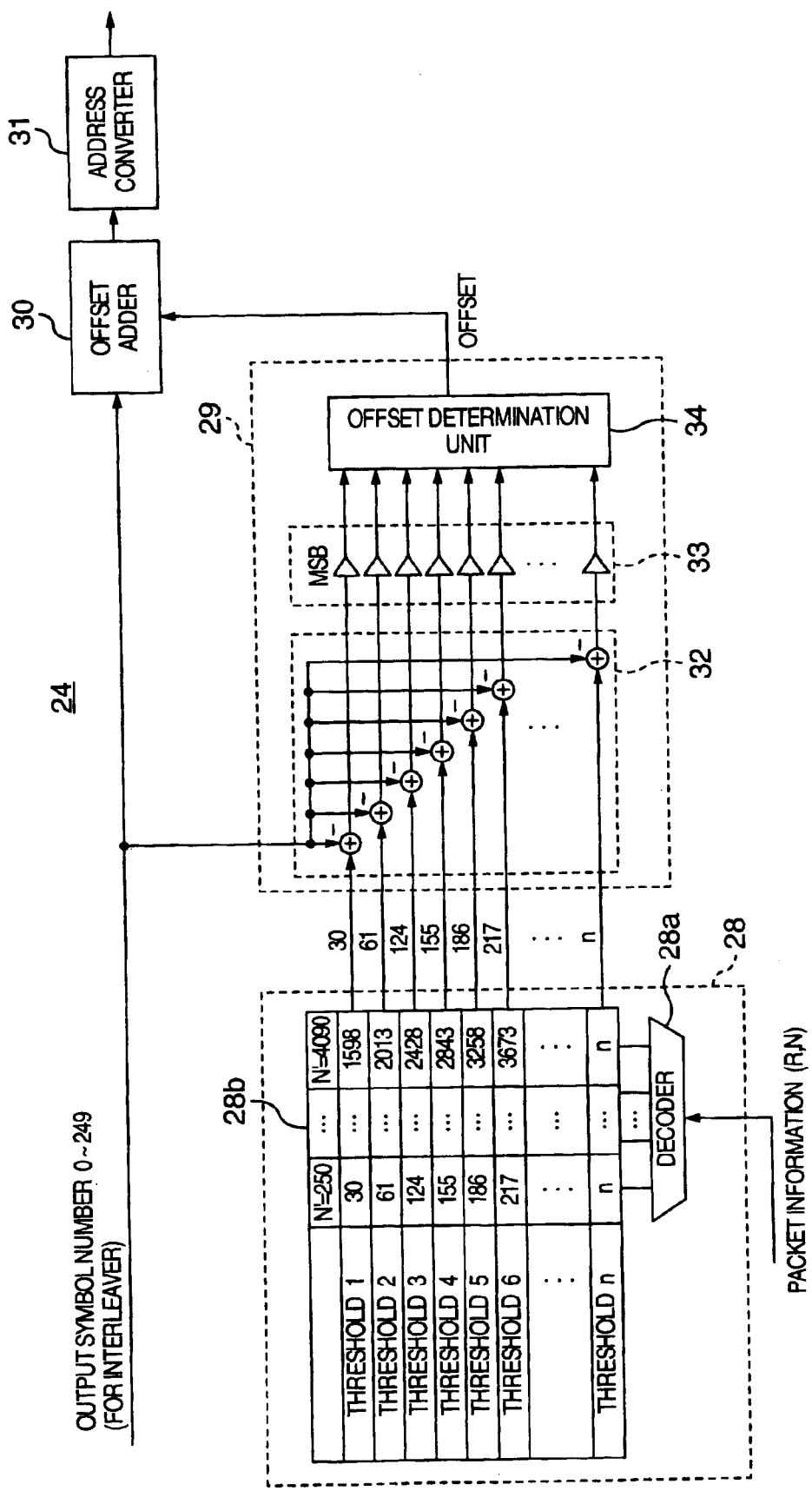
FIG. 5 is a block diagram illustrating an exemplary configuration of an interleave read address generator or a deinterleave write address generator included in the turbo decoder/encoder in the embodiment of the present invention.

FIG. 5 is a block diagram illustrating an exemplary configuration of the interleave read address generator 24 in FIG. 2. The interleave read address generator 24 comprises a threshold selector 28 for selecting thresholds based on packet information (coding rate R, data length N); an offset selector 29 for selecting an offset for an output symbol number (for the interleaver); an offset adder 30 for adding an offset selected by the offset selector 29 to the output symbol number (for the interleaver); and an address converter 31 defined in Document 1. The threshold selector 28 has a decoder 28a for decoding a data length N in the packet information; and a memory, for example, a table 28b for storing all thresholds for each N'. The table 28b selects a threshold in accordance with the output of the decoder 28a to output the selected threshold. In the following, the configuration and operation of the turbo decoder 13 (interleave address generator 20, interleave read address generator 24) according to the embodiment of the present invention will be described for N'=250 taken as an example.

Upon receipt of a data sequence N=256 indicated in packet information (coding rate R, data length N), the threshold selector 28 selects thresholds corresponding to N'=250 in the table 28b in accordance with the output of the decoder 28a. Specifically, in accordance with the principles shown in FIG. 4, threshold 1=30, threshold 2=61, threshold 3=124, threshold 4=155, threshold 5=186, and threshold 6=217 are selected and outputted to the offset selector 29. The offset selector 29 subtracts an output symbol number from each of the thresholds 1–6 selected by the threshold selector 28 using an adder/subtractor 32. An MSB (Most Significant Bit) extractor 33 extracts MSB (Most Significant Bit) from each of the subtraction results, and the extracted MSBs are applied to an offset determination unit 34 for determining an offset.

As shown in the table of FIG. 4 for explaining the operational principles, with a data sequence N'=250, the offset determination unit 34 selects an offset +0 for symbol numbers 0–30; an offset +1 for symbol numbers 31–61; an offset +2 for symbol numbers 62–124; an offset +3 for symbol numbers 125–155; an offset +4 for symbol numbers 156–186; an offset +5 for symbol numbers 187–217; and an offset +6 for symbol numbers 218–249, respectively, and outputs the selected offset.

The offset determination unit 34 may be comprised of a simple adder or a decoder. FIG. 6 is a table when the offset determination unit 34 is comprised of a decoder, and shows a truth table when N'=250 mentioned above. Specifically, FIG. 6 shows the relationship between the value of MSB corresponding to each threshold associated with an output symbol number and an offset (decoder output value) when N'=250.

The offset adder 30 adds an offset selected by the aforementioned offset selector 29 to an output symbol number (for the interleaver) to produce an offset for the output symbol number which is applied to the address converter 31. It is therefore possible to generate interleave read addresses in a range in which data exists on the memory, while maintaining the randomness, even with the conventional address converter 31. Also, the need for recalculating addresses is eliminated because of the absence of read addresses which are larger than the data sequence N'. It should be noted that the address converter 31 is defined in Document 1.

The deinterleave address generator 21 of the deinterleaver memory 19 may be configured to have similar configuration and acts to the interleave read address generator 24. Specifically, the write and read operations performed in the interleave address generator 20 are reversed in the deinterleave address generator 21, the deinterleave write address generator 26 may be comprised of the circuits in the same configuration for performing the same operations as the aforementioned interleave read address generator 24.

FIG. 7 is a table for explaining the operation of the turbo decoder/encoder according to the present invention, and the radio base station using the same. In the following, an exemplary operation involved in generating interleave addresses, in accordance with the present invention, will be described in detail with reference to FIG. 7 for a data sequence N=256. As mentioned above, the data sequence except for tail bits is N'=250. Assume that in the configuration of the interleaver illustrated in FIG. 2, an interleaver input sequence is comprised of D0, D1, D2, D3, . . . , D30, D31, D32, . . . , D61, D62, D63, D64, D65, . . . , D192, . . . , D247, D248, D249. In this event, input symbol numbers generated by the input symbol number generator 22 in FIG. 2 are 0, 1, 2, 3, . . . , 30, 31, 32, . . . , 61, 62, 63, 64, 65, . . . , 192, . . . 247, 248, 249, corresponding to the interleaver input sequence. Therefore, the interleaver input sequence is stored in the interleaver memory 18 in the order of D0, D1, D2, D3, . . . , D30, D31, D32, . . . , D61, D62, D63, D64, D65, . . . , D192, . . . , D247, D248, D249. Output symbol numbers generated by the output symbol number generator 23 in FIG. 2 are 0, 1, 2, . . . , 249. However, if the output symbol numbers in this state were inputted to the address converter 31 in FIG. 5, an address 251 at which no data exists would be outputted, for example, for the output symbol number 31, and similarly, an address 254 at which no data exists would be outputted for the output symbol number 63, as shown in FIG. 3. To avoid generating such addresses, the threshold selector 28 in FIG. 5 sets thresholds 1–6 corresponding to N'=250, as shown in FIG. 4, and offsets selected by the offset selectors 29 are used to correct the output symbol numbers, thereby generating address conversion inputs 0, 1, 2, . . . , 30, 32, 33, . . . , 62, 64, 65, . . . , 245. In other words, the address conversion inputs are modified so as not to include output symbol numbers which result in the aforementioned addresses at which no data exists. Then, such address conversion inputs are converted by the address converter 31 to generate interleave read addresses 1, 129, 67, . . . , 248 which are random in a range in which data exists on the memory, while maintaining the randomness. By reading data from addresses thus generated, the input sequence is reordered to produce a sequence D1, D129, D67, D197, . . . , D248.

For the data sequences N'=506, 1018, 2042, 4090 except for tail bits, interleaving can be implemented by similar processing. However, the thresholds in FIG. 4 must be set in accordance with the symbol numbers indicated in FIG. 3.

When a single decoder alone is provided to support a plurality of sequences N', all thresholds are set for the plurality of sequences N' corresponding to the threshold selector 28 shown in FIG. 5 (for example, all thresholds are set for the plurality of sequences N' in the table 28b as shown in FIG. 5), and thresholds are selected for each of the sequences N'.

Since the present invention provides the features as described above, neither interleave read addresses nor deinterleave write addresses need be stored in the memory, as would be required in the prior art. In addition, the present invention eliminates the need for address regeneration which would otherwise be performed when outputting addresses at which no data exists. It is therefore possible to generate interleave read addresses or deinterleave write addresses with logic circuits which are simple in processing configuration.

Specifically, when the embodiment illustrated in FIG. 5 is implemented by logic circuits, a required number of gates is approximately 1500, which is approximately 1/60 as compared with a correspondent implemented by the prior art technique which would require 88576 gates, thereby making it possible to reduce the circuit size.

Figure 8:
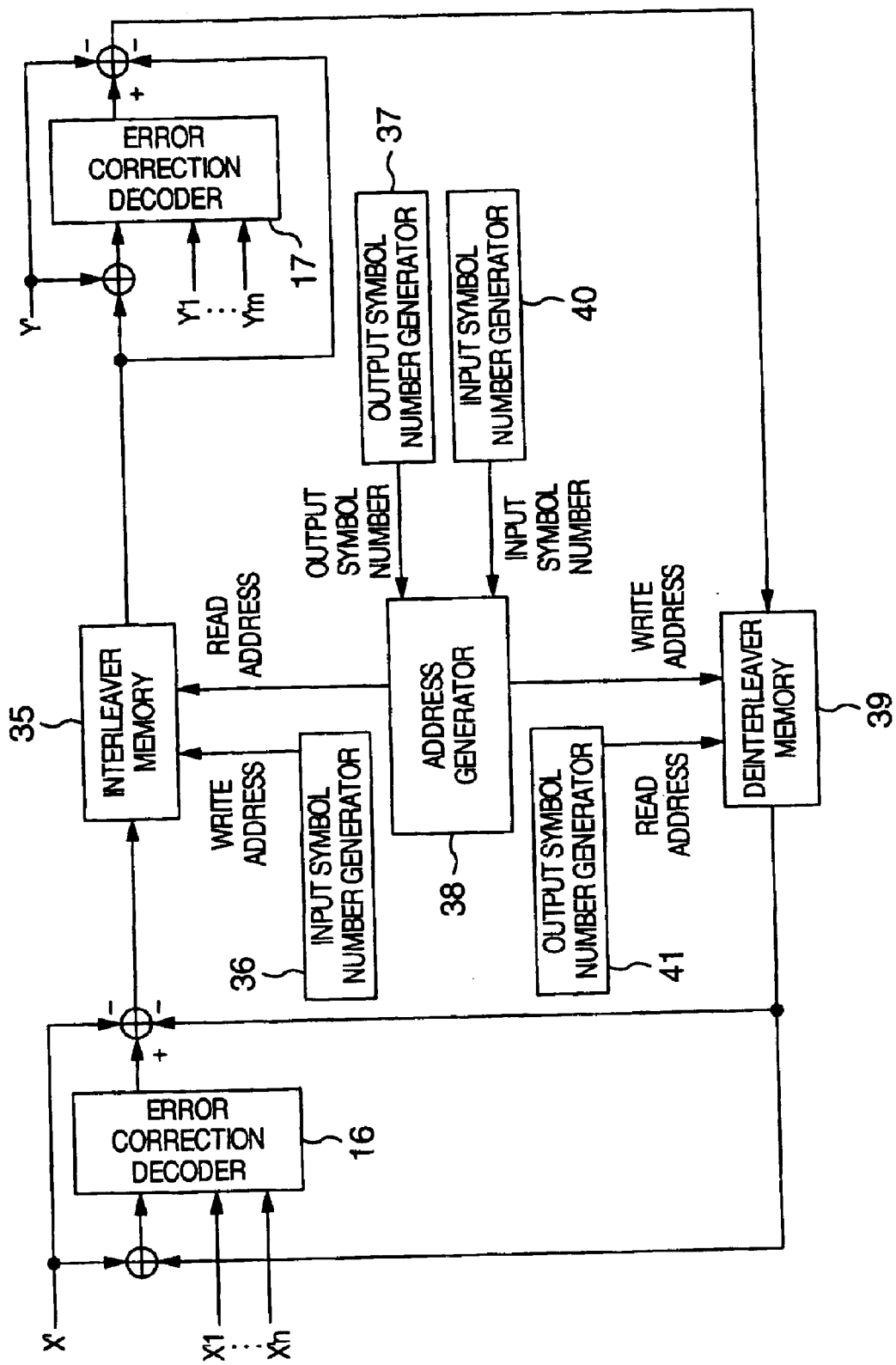
FIG. 8 is a block diagram illustrating another exemplary configuration of the turbo decoder/encoder according to another embodiment of the present invention.

Since the interleave read address generator 24 and the deinterleave write address generator 26 illustrated in FIG. 2 have the same circuit configuration in a single turbo decoder, a single address generator may be shared for both purposes. FIG. 8 is a block diagram illustrating another exemplary configuration of the turbo decoder according to the present invention, wherein a single address generator is shared for the interleave read address generator 24 and the deinterleave write address generator 26 in FIG. 2. An input symbol number generator 36 generates interleave write addresses for an interleaver memory 35. An output symbol number generator 37 outputs output symbol numbers, and an address generator 38 generates interleave read addresses for an interleaver memory 35 based on the output symbol numbers. On the other hand, an input symbol number generator 40 outputs input symbol numbers, and the address generator 38 generates deinterleave write addresses for a deinterleaver memory 39 based on the input symbol numbers. An output symbol number generator 41 in turn generates deinterleave read addresses for the deinterleaver memory 39.

It should be understood that the configuration of FIG. 5 described in connection with the embodiment of the present invention is not limited to the foregoing implementation, but may be additionally modified in various manners. For example, in regard to the internal configuration of the convolutional encoder, when a constraint length K is five (K=5) and the coding rate R is 1/3 (R=1/3), there are eight tail bits. In this event, thresholds 1–8 are set in the threshold selector 28 in FIG. 5 in accordance with the encoding scheme and interleave/deinterleave address generating method, and offsets are found by the offset selector 29 in accordance with these thresholds. Then, the offsets are used to correct output symbol numbers (for the interleaver) or input symbol numbers (for the deinterleaver), thereby making it possible to generate interleave read addresses within a range in which data exists on the memory while maintaining the randomness.

In a communication system, the processing performed by a turbo encoder and a turbo decoder is determined by previously determined parameters such as the constraint length K and the coding rate R of the convolutional encoder. Also, the processing performed by an interleaver of the turbo decoder is the same as that performed by an interleaver of the turbo encoder. In other words, the interleaver of the turbo encoder can be implemented using the interleaver of the aforementioned turbo decoder according to the present invention.

Figure 9:
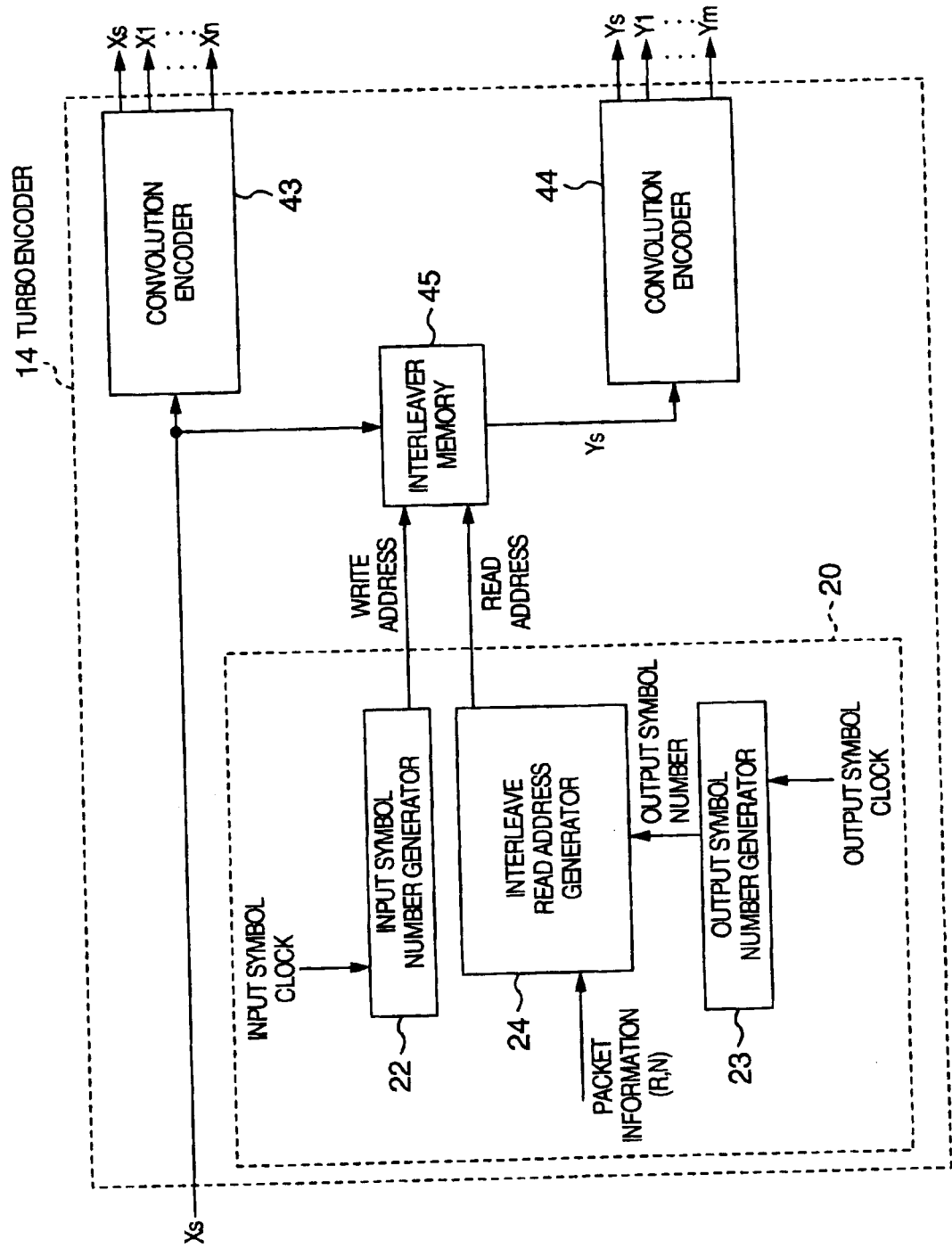
FIG. 9 is a block diagram illustrating an exemplary configuration of the turbo encoder in the embodiment of the present invention.

FIG. 9 is a block diagram illustrating an exemplary configuration of the turbo encoder 14 according to the present invention. The turbo encoder 14 comprises a convolutional encoder 43 for convolutional encoding a data sequence Xs; a convolutional encoder 44 for convolutional encoding an interleaved data sequence Ys; an interleaver memory 45; and an interleave address generator 20 for managing write/read addresses for the interleaver memory 45. An input symbol number generator 22 for generating write addresses for the interleaver memory 45 receives an input symbol clock supplied from the outside, generates sequential numbers in response to this clock, and generates interleave write addresses at which the input sequence is written into the interleaver memory 45. An output symbol number generator 23 for outputting symbol numbers generated by a built-in counter receives an output symbol clock supplied from the outside, similar to the input symbol clock supplied to the input symbol number generator 22, counts the clock using a counter, and generates sequential numbers (output symbol numbers) in accordance with count values. The present invention generates random read addresses from the memory, wherein the interleave read address generator 24 previously adds an offset to an output symbol number generated by the output symbol number generator 23 so as not to generate an address in the memory, calculated in accordance with the provision of Document 1, at which no data exists, and generates interleave read addresses for randomly reading a data sequence stored in the interleaver memory 45. With the provision of the foregoing configuration, the interleaver of the turbo decoder according to the present invention, when used, can implement an interleaver of a turbo encoder.

As described above, the present invention can advantageously implement the interleave read address generator or the deinterleave write address generator in smaller circuit size. Also, a single address generator is used both as the interleave read address generator and the deinterleave write address generator, thereby further reducing the circuit size and power consumption. Moreover, for radio communication using the turbo codes as illustrated in FIG. 1, a high speed communication is available because of the elimination of the need for recalculating the addresses.

What is claimed is:

1. A turbo decoder comprising:
   a first and a second error correction decoder for error-correction decoding encoded data;
   an interleaver memory for storing a soft output decoded result calculated by said first decoder as an interleaver input sequence; and
   an interleave address generator for generating write addresses for storing said interleaver input sequence in said interleaver memory, and read addresses for randomly reading an interleaver input sequence stored in said interleaver memory,
   wherein said interleave address generator adds an offset to a symbol number for said interleaver input sequence for correction, and converts the corrected symbol number for said interleaver input sequence to generate the read address when an address for randomly reading the interleaver input sequence stored in said interleaver memory exceeds the number of bits resulting from a subtraction of tail bits from the number of information bits of the interleaver input sequence.

2. A turbo decoder according to claim 1, wherein:
   said interleave address generator specifies the symbol numbers for the interleaver input sequence as addresses at which the interleaver input sequence is stored in said interleaver memory, and sequentially converts the symbol numbers for the interleaver input sequence stored in said interleaver memory to generate the read addresses for the interleaver input sequence stored in said interleaver memory.

3. A turbo decoder according to claim 2, wherein said interleave address generator comprises:

an output symbol number generator for sequentially generating symbol numbers for an interleaver input sequence stored in said interleaver memory; and a threshold selector for setting a unique threshold for each of the symbol numbers generated by said output symbol number generator.

4. A turbo decoder according to claim 3, wherein:

said threshold selector selects a plurality of thresholds in accordance with the number of information bits of said interleaver input sequence, wherein said thresholds each correspond to an output symbol number generated by said output symbol number generator for each of the number of information bits of said interleaver input sequence, said output symbol number generator possibly generating an address, the value of which exceeds the number of bits excluding tail bits from the number of information bits of said interleaver input sequence.

5. A turbo decoder according to claim 4, wherein:

said interleave address generator comprises an offset selector for selecting an offset, said offset being added to the output symbol number from said output symbol number generator, in accordance with a threshold value selected from said threshold selector.

6. A radio base station having an antenna, a radio frequency unit, a baseband unit, and a communication interface for interfacing said baseband unit with a communication network, wherein:

said baseband unit comprises a turbo decoder for decoding encoded data, said turbo decoder including:

a first and a second error correction decoder for error-correction decoding encoded data;

an interleaver memory for storing soft output decoded results calculated by a plurality of said first decoders as an interleaver input sequence; and an interleave address generator for generating write addresses for storing said interleaver input sequence in said interleaver memory, and read addresses for randomly reading an interleaver input sequence stored in said interleaver memory, wherein said interleave address generator adds an offset to a symbol number for said interleaver input sequence for correction, and converts the corrected symbol number for said interleaver input sequence to generate the read address when an address for randomly reading the interleaver input sequence stored in said interleaver memory exceeds the number of bits resulting from a subtraction of tail bits from the number of information bits of the interleaver input sequence.

7. A radio base station according to claim 6, wherein:

said interleave address generator specifies the symbol numbers for the interleaver input sequence as addresses at which the interleaver input sequence is stored in said interleaver memory, and sequentially converts the symbol numbers for the interleaver input sequence stored in said interleaver memory to generate the read addresses for the interleaver input sequence stored in said interleaver memory.

8. A radio base station according to claim 7, wherein said interleave address generator comprises:

an output symbol number generator for sequentially generating symbol numbers for an interleaver input sequence stored in said interleaver memory; and a threshold selector for setting a unique threshold for each of the symbol numbers generated by said output symbol number generator.

9. A radio base station according to claim 8, wherein:

said threshold selector selects a plurality of thresholds in accordance with the number of information bits of said interleaver input sequence, wherein said thresholds each correspond to an output symbol number generated by said output symbol number generator for each of the number of information bits of said interleaver input sequence, said output symbol number generator possibly generating an address, the value of which exceeds the number of bits excluding tail bits from the number of information bits of said interleaver input sequence.

10. A radio base station according to claim 9, wherein:

said interleave address generator comprises an offset selector for selecting an offset, said offset being added to the output symbol number from said output symbol number generator, in accordance with a threshold value selected from said threshold selector.

11. A turbo encoder comprising:

a convolutional encoder for convolutional encoding transmission data;

an interleaver memory for storing transmission data; and interleave address generator for generating write addresses for storing transmission data in said interleaver memory, and read addresses for randomly reading data comprising transmission data stored in said interleaver memory, wherein said interleave address generator adds an offset to a symbol number for each bit of the transmission data, and converts said corrected symbol number to generate the read address, when an address for randomly reading the transmission data stored in said interleaver memory exceeds the number of bits resulting from a subtraction of tail bits from the number of information bits of the transmission data.

12. A turbo encoder comprising:

a plurality of convolutional encoders each for convolutional encoding information bits to be transmitted;

an interleaver memory for storing information bits to be transmitted; and an interleave address generator for generating interleave addresses for randomly reading information bits stored in said interleaver memory, wherein said interleave address generator converts a symbol number corresponding to an input symbol sequence to an address in accordance with a unique address conversion method to generate an interleave address, and corrects the symbol number in accordance with a previously determined rule and converts the corrected symbol number to generate the interleave address when the address converted from the symbol number does not match a previously set symbol number.

13. A turbo encoder according to claim 12, wherein:

said interleave address generator comprises logic circuits.

14. A turbo encoder according to claim 13, wherein said interleave address generator comprises:

an output symbol number generator for sequentially generating symbol numbers for an interleaver input sequence stored in said interleaver memory; and a threshold selector for setting a unique threshold for each of the symbol numbers generated by said output symbol number generator.

15. A turbo encoder according to claim 14, wherein:

said threshold selector selects a plurality of thresholds in accordance with the number of information bits of said interleaver input sequence, wherein said thresholds each correspond to an output symbol number generated by said output symbol number generator for each of the number of information bits of said interleaver input sequence, said output symbol number generator possibly generating an address, the value of which exceeds the number of bits excluding tail bits from the number of information bits of said interleaver input sequence.

16. A turbo encoder according to claim 15, wherein:
said interleave address generator comprises an offset selector for selecting an offset, said offset being added to the output symbol number from said output symbol number generator, in accordance with a threshold value selected from said threshold selector.

* * * * *